(12) United States Patent
Fung et al.

(10) Patent No.: US 11,940,698 B2
(45) Date of Patent: Mar. 26, 2024

(54) LIQUID CRYSTAL ON SILICON PANEL, AND PREPARATION METHOD THEREOF

(71) Applicant: Advanced Silicon Display Optoelectronics Corporation Ltd., Shenzhen (CN)

(72) Inventors: Yeuk-Keung Fung, Hong Kong (HK); Kuo-Lung Huang, Shenzhen (CN)

(73) Assignee: Advanced Silicon Display Optoelectronics Corporation Ltd., Shenzhen (CN)

( * ) Notice: Subject to any disclaimer, the term of this patent is extended or adjusted under 35 U.S.C. 154(b) by 0 days.

(21) Appl. No.: 17/581,843

(22) Filed: Jan. 21, 2022

(65) Prior Publication Data

US 2022/0229337 A1 Jul. 21, 2022

(30) Foreign Application Priority Data

Jan. 21, 2021 (CN) .......................... 202110083908.3

(51) Int. Cl.
| | |
|---|---|
| *G02F 1/1362* | (2006.01) |
| *G02F 1/1333* | (2006.01) |
| *G02F 1/1339* | (2006.01) |
| *G02F 1/1341* | (2006.01) |
| *H01L 21/768* | (2006.01) |
| *H01L 21/78* | (2006.01) |

(52) U.S. Cl.
CPC .. *G02F 1/136277* (2013.01); *G02F 1/133302* (2021.01); *G02F 1/133351* (2013.01); *G02F 1/1339* (2013.01); *G02F 1/1341* (2013.01); *H01L 21/76898* (2013.01); *H01L 21/78* (2013.01)

(58) Field of Classification Search
CPC ......... G02F 1/136277; G02F 1/133351; G02F 2201/42; G02F 1/1339; G02F 1/1345; G02F 1/1341; G02F 2001/13415; G02F 1/1333; G02F 1/133302; G02F 1/13306; H01L 27/1218; H01L 21/76898; H01L 21/78; H01L 27/1262
See application file for complete search history.

(56) References Cited

U.S. PATENT DOCUMENTS

2003/0197816 A1* 10/2003 Winer .................. G02F 1/1341
 257/E21.597
2007/0290300 A1* 12/2007 Kawakami ........ H01L 21/76898
 438/109

(Continued)

*Primary Examiner* — Jia X Pan
(74) *Attorney, Agent, or Firm* — ScienBiziP, P.C.

(57) ABSTRACT

An LCoS panel and a method of preparation includes wafer level packaging, manufacturing vias through a silicon substrate in each die area of a wafer substrate, and manufacturing conductive interfaces on a back surface of the wafer substrate. Each conductive interface corresponds to one via and so connected to an active circuit of the die area where the conductive interface is located. Liquid crystal packaging is applied, a seal coated to surround the pixel circuit area of the active circuit on a front surface of the wafer substrate, injecting liquid crystal into a space defined by the seal, the seal coupling glass substrate comprising a transparent conductive layer and the wafer substrate, and then cutting. Wafer level chip scale packaging of the LCoS panels is thus achieved, the cost is reduced, the obtained LCoS panels are small in total area and of greater thinness.

17 Claims, 8 Drawing Sheets

(56) References Cited

U.S. PATENT DOCUMENTS

2014/0085579 A1* 3/2014 Fan .................. G02F 1/1337
                                                    349/122
2019/0084868 A1* 3/2019 Nomura .................. B32B 9/04
2022/0320148 A1* 10/2022 Huang .............. G02F 1/133351

* cited by examiner

US 11,940,698 B2

LIQUID CRYSTAL ON SILICON PANEL, AND PREPARATION METHOD THEREOF

TECHNICAL FIELD

The present disclosure generally relates to the field of semiconductor technology, in particular to a liquid crystal on silicon (LCoS) panel and a preparation method of the LCoS panel.

BACKGROUND

Wafer level packaging (WLP) is an efficient method for mass production of chips. Compared with simple integrated circuit chips, LCoS panels include not only integrated circuits, but also liquid crystal packaging structures. To build a complete LCoS wafer level packaging production line, not only sectioning for implementing integrated circuit packaging is required, but also sectioning for implementing liquid crystal packaging production line is required. At present, there is no such a complete production line, which can only be achieved by means of equipment customization or equipment transformation. The cost of the equipment customization or equipment transformation is very high

SUMMARY

One aspect of the present disclosure provides a preparation method of an LCoS panel. The preparation method of the LCoS panel includes providing a wafer substrate. The wafer substrate includes a silicon substrate and a plurality of die areas defined by a plurality of intersecting dividing lines. The silicon substrate includes a first surface and a second surface opposite to the first surface, each of the plurality of die areas includes an active circuit on the first surface, and the active circuit includes a pixel circuit area and a peripheral circuit area. The preparation method of the LCoS panel further includes performing wafer level packaging by: manufacturing a plurality of vias extending through the first surface and the second surface in each of the plurality of die areas of the wafer substrate; and manufacturing a plurality of conductive interfaces on the second surface. Each of the plurality of conductive interfaces is arranged to correspond to one of the plurality of vias, and each of the plurality of conductive interfaces is electrically connected to the active circuit of one of the plurality of die areas where the conductive interface is located by a corresponding one of the plurality of vias. The preparation method of the LCoS panel further includes performing liquid crystal packaging by: forming a seal on the first surface in each of the plurality of die areas of the wafer substrate, wherein the seal at least surrounds the pixel circuit area of the active circuit, and defines a liquid crystal space of one of the plurality of die areas where the seal is located; injecting liquid crystal into the liquid crystal space of the wafer substrate; providing a glass substrate including a transparent conductive layer, and coupling a surface of the glass substrate with the transparent conductive layer and the wafer substrate by the seal. The preparation method of the LCoS panel further includes cutting the wafer substrate along the plurality of dividing lines, cutting the glass substrate, and further obtaining a plurality of LCoS panels. An LCoS module is obtained when one of the plurality of LCoS panels is electrically connected to an external circuit substrate, and the active circuit is electrically connected to the external circuit substrate by the plurality of vias and the plurality of conductive interfaces in sequence.

The preparation method of the LCoS panel brings the advantages of the manufacturing process by using through-silicon via (TSV) technology on the wafer substrate, which makes it possible to separate the front-end circuit packaging from the back-end liquid crystal packaging and create two independent parts. Specifically, by using the TSV technology to manufacture vias (metallized holes) extending through the silicon substrate, the active circuits on the wafer substrate are electrically connected to the conductive interfaces on the back side of the wafer substrate (i.e., the second surface) by the vias, thus the circuit packaging is completed. After that, the liquid crystal packaging process is mainly carried out on the front side of the wafer substrate (that is, a side of the first surface), which will not cause damage to the circuit packaging structure, and there is no need for additional circuit packaging on the front side of the wafer substrate during the liquid crystal packaging process. After the liquid crystal packaging is completed, dicing and cutting steps can be performed to obtain a single LCoS panel, and there is no need for further die level packaging of the LCoS panel. The downstream processes of manufacture only need to install directly on the external circuit substrate to obtain the LCoS module. That is, the two processes of circuit packaging and liquid crystal packaging can be completely and independently performed by different factories/workshops/equipment, and both of them are at wafer level, which avoids constant reciprocation in different factories/workshops/equipment while different links of the same process are carried out by different factories or workshops or equipment. In a counter example, step A and step C would be carried out in the factory/workshop/equipment for wafer packaging, and step B and step D would be carried out in the factory or workshop or equipment for liquid crystal filling. If the production was carried out in the order of A-B-C-D steps, the wafers would need to be transported back and forth between the two factories or workshops or equipment, resulting in reduced yield. At the same time, the preparation method of the LCoS panel enables the rapid introduction of mass production with the help of mature wafer-level packaging plants and liquid crystal packaging plants at the initial stage of the industry, which solves the problems of excessive initial input cost and long investment cycle. In summary, the preparation method of the LCoS panel makes cost control, production planning, and output improvement simpler and easier.

In addition, the TSV technology is used on the wafer substrate to form vias extending through the silicon substrate, so that the LCoS panel is directly connected to the external circuit substrate through the conductive interfaces on the back side, and the LCoS module with compact package structure can be obtained. The overall size of the LCoS module is reduced, at the same time, the signal processing speed is increased, the signal distortion is small, and the total power consumption is low. The technical solution does not require FPC wires to connect the LCoS panel to the external circuit substrate, and can achieve mass production at an advantageous material cost. Moreover, the flow of current of the LCoS panel of the structure is perpendicular to the panel direction, which achieves greater thinness. Generally, the LCoS panel of the structure has only a three-layer structure, namely of a glass substrate layer, a liquid crystal layer, and a wafer substrate layer. There is no need to set up redundant metal plates and heat sinks on the back side, and it can be used for head-mounted displays and micro-projectors.

The present disclosure also provides a preparation method of an LCoS panel. The preparation method of the LCoS panel includes providing a wafer substrate, wherein the wafer substrate includes a silicon substrate and a plurality of die areas defined by a plurality of intersecting dividing lines, and the silicon substrate includes a first surface and a second surface opposite to the first surface. The preparation method of the LCoS panel further includes performing wafer level packaging by: manufacturing a plurality of vias extending through the first surface and the second surface in each of the plurality of die areas of the wafer substrate; manufacturing an active circuit on the first surface in each of the plurality of die areas, wherein the active circuit includes a pixel circuit area and a peripheral circuit area; and manufacturing a plurality of conductive interfaces on the second surface. Each of the plurality of conductive interfaces is arranged to correspond to one of the plurality of vias, and the active circuit is electrically connected to the plurality of conductive interfaces by the plurality of vias. The preparation method of the LCoS panel further includes performing liquid crystal packaging by: forming a seal on the first surface in each of the plurality of die areas of the wafer substrate, wherein the seal at least surrounds the pixel circuit area of the active circuit, and defines a liquid crystal space of one of the plurality of die areas where the seal is located; injecting liquid crystal into the liquid crystal space of each of the plurality of die areas of the wafer substrate; providing a glass substrate including a transparent conductive layer, and coupling a surface of the glass substrate with the transparent conductive layer and the wafer substrate by the seal. The preparation method of the LCoS panel further includes cutting the wafer substrate along the plurality of dividing lines and the glass substrate, and obtaining a plurality of LCoS panels, wherein an LCoS module is obtained when one of the plurality of LCoS panels is electrically connected to an external circuit substrate, and the active circuit is electrically connected to the external circuit substrate by the plurality of vias and the plurality of conductive interfaces in sequence.

The preparation method is the same as the concept of the preparation in the Summary of the present disclosure, both of which separate the wafer-level circuit packaging and the wafer-level liquid crystal packaging into two complete and independent processes. The difference between the two is whether the manufacturing of the integrated circuit is before or after the manufacturing of the vias. The manufacturing of the integrated circuit and the circuit packaging can be realized in the fab. The concept of the separation process based on the two methods is the same and the structural characteristics of the LCoS panel enabling the process separation to be realized are the same. Therefore, the beneficial effects achieved by the two methods are the same, and will not be repeated here.

Another aspect of the present disclosure provides an LCoS panel. The LCoS panel includes a wafer substrate, a glass substrate, a seal, and liquid crystal. The wafer substrate includes a silicon substrate including a first surface and a second surface opposite to the first surface, an active circuit arranged on the first surface, a plurality of conductive interfaces arranged on the second surface, and a plurality of vias extending through the first surface and the second surface. The active circuit includes a pixel circuit area and a peripheral circuit area. Each of the plurality of conductive interfaces is arranged to correspond to one of the plurality of vias, and electrically connected to the active circuit by a corresponding one of the plurality of vias. The glass substrate includes a transparent conductive layer, and is opposite to the wafer substrate. The seal is arranged between the wafer substrate and the glass substrate, surrounds the pixel circuit area of the active circuit, and defines a liquid crystal space. The liquid crystal is in the liquid crystal space. One of the plurality of conductive interfaces is configured to electrically connect the LCoS panel to an external circuit substrate.

The structure of the LCoS panel makes it possible to separate the front-end circuit packaging and the back-end liquid crystal packaging process into two independent parts by using TSV technology on the wafer substrate. Specifically, by using the TSV technology to manufacture vias extending through the silicon substrate, the active circuits on the wafer substrate are electrically connected to the conductive interfaces on the back side of the wafer substrate by the vias, thus the circuit packaging is completed. After that, the liquid crystal packaging process is mainly carried out on the front side of the wafer substrate, which will not cause damage to the circuit packaging structure, and there is no need for additional circuit packaging on the front side of the wafer substrate during the liquid crystal packaging process. After the liquid crystal packaging is completed, dicing, and cutting steps can be performed to obtain a single LCoS panel, and the LCoS panel can be directly installed on the external circuit substrate without further die level packaging. The structure enables circuit packaging and liquid crystal packaging to be realized at wafer level, which makes cost control, production planning, and yield improvement easier. The flow of current of the LCoS panel of the structure is perpendicular to the panel direction, which achieves greater thinness. Generally, the LCoS panel of the structure has only a three-layer structure, namely of a glass substrate layer, a liquid crystal layer, and a wafer substrate layer. There is no need to set up redundant metal plates and heat sinks on the back side, and it can be used for head-mounted displays and micro-projectors.

DESCRIPTION OF EMBODIMENTS

Figure 1:
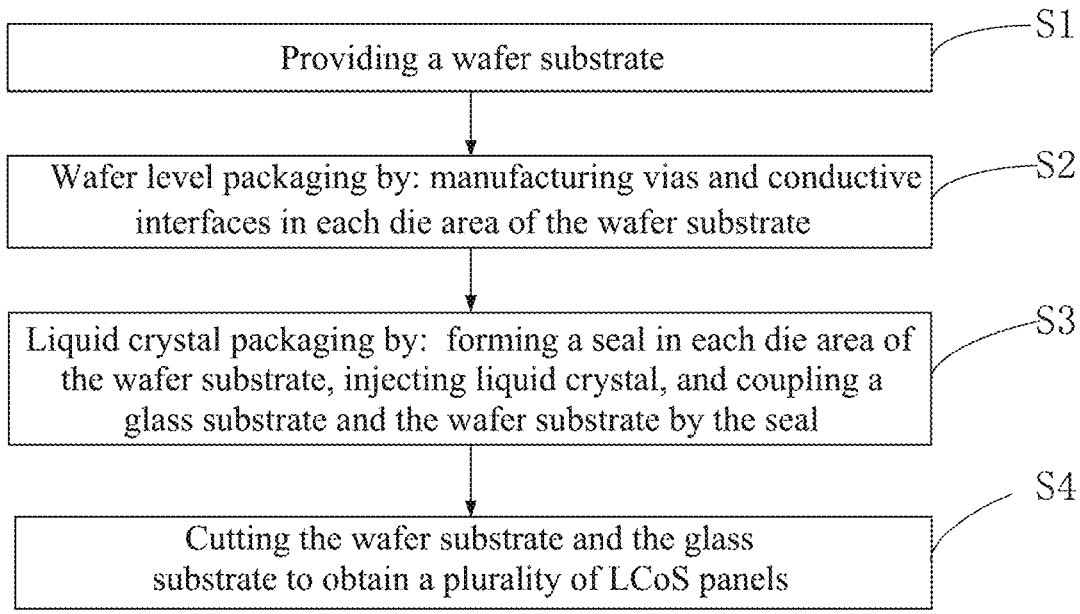
FIG. 1 is a flowchart of a method for preparing an LCoS panel according to an embodiment of the present disclosure.

In the following, the technical solutions of the embodiments of the present disclosure will be clearly and completely described in conjunction with the accompanying drawings of the embodiments of the present invention. Obviously, the described embodiments are only a part of embodiments, but not all embodiments.

Unless otherwise defined, all technical and scientific terms used herein have the same meaning as commonly understood by those skilled in the technical field of the present disclosure. The terms used in the description of the present disclosure herein are only for the purpose of describing specific embodiments, and are not intended to limit the present disclosure.

In the present disclosure, a die refers to a part of the LCoS panel that does not include a liquid crystal packaging structure (liquid crystal, glass substrate, seal, etc.), and mainly includes a wafer substrate (silicon substrate and active circuit, etc.) and a circuit packaging structure (vias and conductive interfaces, etc.). An LCoS panel includes a die and a liquid crystal packaging structure, and can be independently sold as a product. An LCoS module includes an LCoS panel and an external circuit substrate, which can be obtained by combining the LCoS panel with a PCB board by a downstream process. The LCoS panel can also be assembled and sold with an external circuit substrate after produced. The functional integrity of the LCoS panel is not limited by the external circuit substrate.

One aspect of the present disclosure provides a preparation method of an LCoS panel. The preparation method of the LCoS panel includes providing a wafer substrate. The wafer substrate includes a silicon substrate and a plurality of die areas defined by a plurality of intersecting dividing lines. The silicon substrate includes a first surface and a second surface opposite to the first surface, each of the plurality of die areas includes an active circuit on the first surface, and the active circuit includes a pixel circuit area and a peripheral circuit area. The preparation method of the LCoS panel further includes performing wafer level packaging by: manufacturing a plurality of vias extending through the first surface and the second surface in each of the plurality of die areas of the wafer substrate; and manufacturing a plurality of conductive interfaces on the second surface. Each of the plurality of conductive interfaces is arranged to correspond to one of the plurality of vias, and each of the plurality of conductive interfaces is electrically connected to the active circuit of one of the plurality of die areas where the conductive interface is located by a corresponding one of the plurality of vias. The preparation method of the LCoS panel further includes performing liquid crystal packaging by: forming a seal on the first surface in each of the plurality of die areas of the wafer substrate, wherein the seal at least surrounds the pixel circuit area of the active circuit, and defines a liquid crystal space of one of the plurality of die areas where the seal is located; injecting liquid crystal into the liquid crystal space of the wafer substrate; providing a glass substrate including a transparent conductive layer, and coupling a surface of the glass substrate with the transparent conductive layer and the wafer substrate by the seal. The preparation method of the LCoS panel further includes cutting the wafer substrate along the plurality of dividing lines, cutting the glass substrate, and further obtaining a plurality of LCoS panels. An LCoS module is obtained when one of the plurality of LCoS panels is electrically connected to an external circuit substrate, and the active circuit is electrically connected to the external circuit substrate by the plurality of vias and the plurality of conductive interfaces in sequence.

The present disclosure also provides a preparation method of an LCoS panel. The preparation method of the LCoS panel includes providing a wafer substrate, wherein the wafer substrate includes a silicon substrate and a plurality of die areas defined by a plurality of intersecting dividing lines, and the silicon substrate includes a first surface and a second surface opposite to the first surface. The preparation method of the LCoS panel further includes performing wafer level packaging by: manufacturing a plurality of vias extending through the first surface and the second surface in each of the plurality of die areas of the wafer substrate; manufacturing an active circuit on the first surface in each of the plurality of die areas, wherein the active circuit includes a pixel circuit area and a peripheral circuit area; and manufacturing a plurality of conductive interfaces on the second surface. Each of the plurality of conductive interfaces is arranged to correspond to one of the plurality of vias, and the active circuit is electrically connected to the plurality of conductive interfaces by the plurality of vias. The preparation method of the LCoS panel further includes performing liquid crystal packaging by: forming a seal on the first surface in each of the plurality of die areas of the wafer substrate, wherein the seal at least surrounds the pixel circuit area of the active circuit, and defines a liquid crystal space of one of the plurality of die areas where the seal is located; injecting liquid crystal into the liquid crystal space of each of the plurality of die areas of the wafer substrate; providing a glass substrate including a transparent conductive layer, and coupling a surface of the glass substrate with the transparent conductive layer and the wafer substrate by the seal. The preparation method of the LCoS panel further includes cutting the wafer substrate along the plurality of dividing lines and the glass substrate, and obtaining a plurality of LCoS panels, wherein an LCoS module is obtained when one of the plurality of LCoS panels is electrically connected to an external circuit substrate, and the active circuit is electrically connected to the external circuit substrate by the plurality of vias and the plurality of conductive interfaces in sequence.

In order to further illustrate the technical means and effects adopted by the present disclosure to achieve the predetermined purpose, the following detailed description of the present disclosure will be given below in conjunction with the accompanying drawings and preferred embodiments.

FIG. 1 is a flowchart of a method for preparing an LCoS panel according to an embodiment of the present disclosure. As shown in FIG. 1, the preparation method of the LCoS panel includes the following steps.

Step S1: providing a wafer substrate.

Step S2: wafer level packaging, manufacturing vias and conductive interfaces in each die area of the wafer substrate.

Step S3: liquid crystal packaging, forming a seal in each die area of the wafer substrate, injecting liquid crystal into the seal, coupling a glass substrate and the wafer substrate by the seal.

Step S4: cutting the glass substrate and the wafer substrate, and obtaining a plurality of LCoS panels.

When the LCoS panels obtained by the preparation method of the present disclosure are applied to products, the method further includes a step S5: mounting the LCoS panels, making each LCoS panel being electrically connected to an external circuit substrate, and obtain a plurality of LCoS modules. Step S5 does not have to be regarded as a necessary step in the preparation method of the LCoS panel.

The preparation method of the LCoS panel is described below with reference to FIGS. 2 through 12.

In step S1, a wafer substrate is provided.

Figure 2:
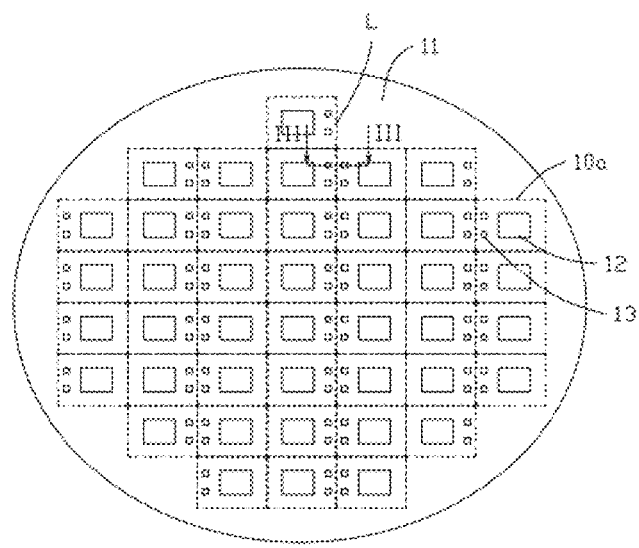
FIG. 2 is a schematized top view of a wafer substrate provided by step S1 of the method in FIG. 1.

As shown in FIG. 2, the wafer substrate 10 includes a silicon substrate 11. The wafer substrate 10 includes a plurality of die areas 10a defined by a plurality of intersecting dividing lines L. The dividing lines L are represented by a dotted line in the drawings, and the dividing lines L can be either actual scribe lines or virtual lines. Each die area 10a includes an active circuit 12. The active circuit 12 includes at least a pixel circuit area and a peripheral circuit area.

Figure 3:
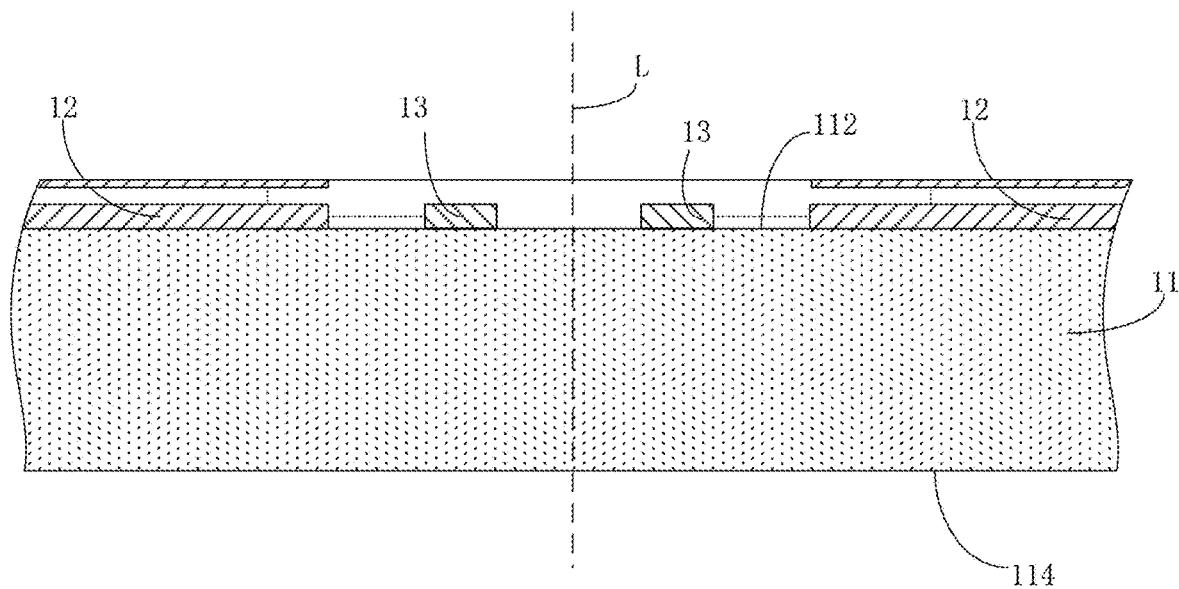
FIG. 3 is a schematized cross-sectional view along line of FIG. 2.

As shown in FIG. 3, the silicon substrate 11 has a first surface 112 and a second surface 114 opposite to each other. The first surface 112 may also be referred to as a front surface of the silicon substrate, and the second surface 114 may also be referred to as a back surface of the silicon substrate. The active circuit 12 is arranged on the first surface 112. In one embodiment, a thickness of the silicon substrate 11 is in a range of 60 μm to 200 μm, and an overall thickness of the LCoS panel finally prepared by the thickness of the silicon substrate is thin, which is favorable for application in scenarios such as head-mounted display or micro-projection. In other embodiments, the thickness of the silicon substrate 11 is in a range of 60 μm to 750 μm. Preferably, the thickness of the silicon substrate 11 is between 100 μm and 200 μm, which takes into account product size, mechanical reliability and optical flatness, and is also conducive to the subsequent TSV processes.

The active circuit 12 includes a plurality of metal layers. In FIG. 3, only two metal layers are shown. It can be understood that, in other embodiments, the active circuit may include more metal layers. The plurality of metal layers can be stacked in a direction perpendicular to the silicon substrate 11, a dielectric layer (such as silicon glass) is arranged between different metal layers, and the dielectric layer (not shown) is also arranged between the metal layers and the silicon substrate 11. The metal layers include a plurality of input/output terminals 13. The active circuit 12 is electrically connected to external circuit structures by the input/output terminals 13. Since the active circuit 12 and the input/output terminals 13 are electrically connected (indicated by dotted lines in the figure) and both belong to the same metal layer, the input/output terminals 13 can be regarded as a part of the active circuit 12, which is etched at the same time when the integrated circuit is manufactured. In FIG. 2, only two input/output terminals 13 are shown in each die area 10a. In other embodiments, the number of input/output terminals 13 in each die area 10a is not limited.

In an embodiment of the present disclosure, the diameter of the wafer substrate 10 is, for example, 8 inches (200 mm). A material of the silicon substrate 11 is, for example, bulk silicon, silicon germanium, silicon carbide, and the like.

The active circuit 12 specifically includes an active display drive circuit matrix and a plurality of reflective electrodes (not shown). The active display drive circuit matrix includes a plurality of metal oxide semiconductor (MOS) transistors (not shown).

In one embodiment, the wafer substrate can be obtained through integrated circuit manufacture before or in step S1. The step can be performed in a fab.

In step S2, a wafer level packaging is performed, and vias and conductive interfaces are manufactured in each die area of the wafer substrate.

A plurality of vias (metallized holes) extending through the first surface and the second surface is manufactured in each die area 10a of the wafer substrate obtained in step S1, and a plurality of conductive interfaces is manufactured on the second surface in each die area 10a.

Figure 4:
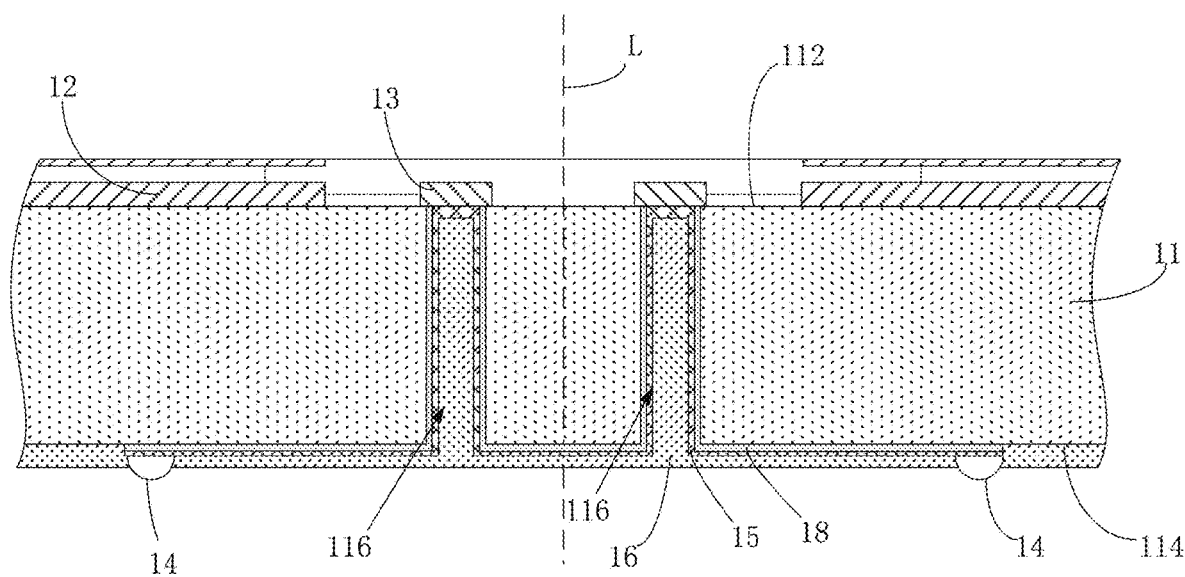
FIG. 4 is a schematized cross-sectional view of the wafer substrate provided by step S2 of the method in FIG. 1.

As shown in FIG. 4, the silicon substrate 11 has vias 116 extending through the first surface 112 and the second surface 114. Each via 116 is arranged to correspond to one input/output terminal 13. Similarly, a number of the vias 116 included in one die area 10a is not limited to the number shown in the figure. Conductive interfaces 14 spaced apart from each other are arranged on the second surface 114 of the silicon substrate 11. Each conductive interface 14 is arranged correspondingly to one via 116, and each conductive interface 14 is electrically connected to the active circuit 12 of the die area 10a where the conductive interface 14 is located by a corresponding one via 116.

In a specific embodiment, through holes are formed on the silicon substrate 11 corresponding to the input/output terminals 13, a patterned insulating film layer 18 and a conductive layer 15 are then formed in the through holes and on the second surface 114 of the silicon substrate 11, thus forming the vias 116. The insulating film layer 18 covers inner wall surfaces of the through holes, and the conductive layer 15 covers inner wall surfaces of holes formed by the insulating film layer 18, so that the insulating film layer 18 insulates the conductive layer 15 from contacting the silicon substrate 11, and the conductive layer 15 is deposited on the surface of the input/output terminals 13 at one end of the through holes to electrically connect the input/output terminals 13. Specifically, the through holes are first opened on the silicon substrate 11, then the insulating film layer 18 is deposited, and then a part of the insulating film layer 18 at the bottom of the through holes is etched away, so that the input/output terminals 13 are exposed, and the conductive layer 15 is lastly deposited. In FIG. 4, the wafer substrate 10 further includes an insulating layer 16. The insulating layer 16 exposes a portion of the patterned conductive layer 15 on the second surface 114, and the conductive interfaces 14 are formed on the exposed patterned conductive layer 15.

A material of the insulating layer 16 is, for example, polyimide (PI) or epoxy, and the insulating material can be infilled in the vias 116. A material of the patterned conductive layer 15 is, for example, copper or other metals, or metal alloys. A material of the conductive interfaces 14 is one or a group, for example, selected from tin, tin-silver, tin-lead, tin-silver-copper, tin-silver-zinc, tin-zinc, tin-bismuth-indium, tin-indium, tin-gold, tin-copper, tin-zinc-indium, and tin-silver-antimony, and the material of the conductive interfaces 14 may include an active agent.

In step S3, liquid crystal packaging is performed, wherein a seal is formed in each die area 10a of the wafer substrate 10, liquid crystal is injected into the seal, and the glass substrate with the wafer substrate are coupled together by the seal.

Figure 5:
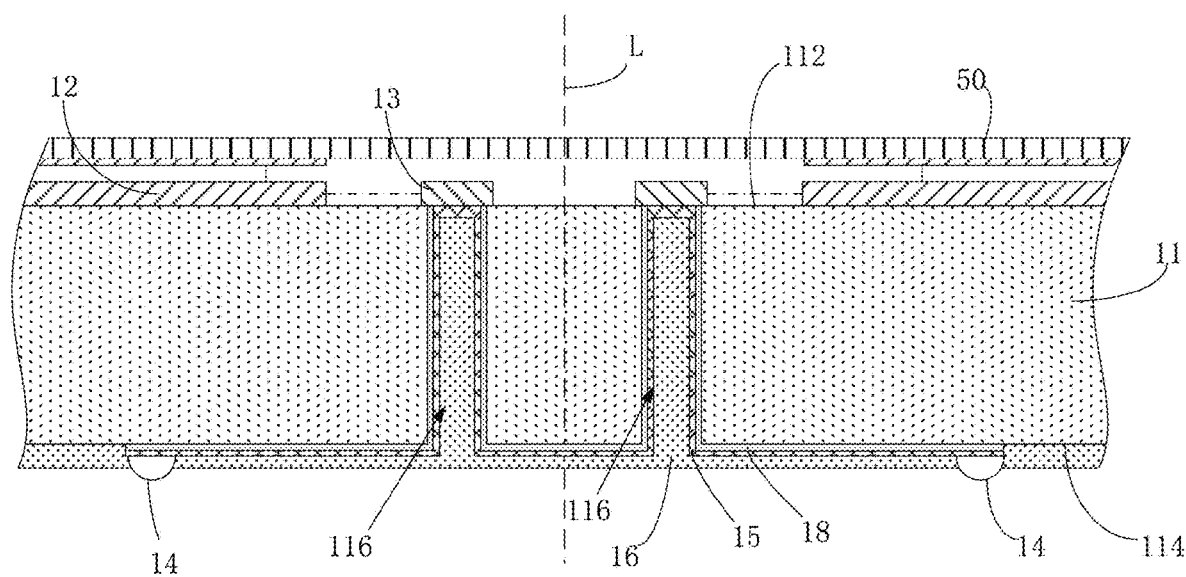
FIG. 5 is a schematized view of an alignment layer formed on the wafer substrate in FIG. 4 provided by step S3 of the method of FIG. 1.

In one embodiment, step S3 further includes cleaning the wafer substrate 10 (for example, cleaning with deionized water followed by plasma cleaning), and forming an alignment layer 50 on the wafer substrate 10 (as shown in FIG. 5). The alignment layer 50 is used to initialize an orientation of liquid crystal molecules, so that the orientations of the liquid crystal molecules at different positions are consistent. Forming the alignment layer 50 can include an alignment film formed on the wafer substrate 10 by evaporation, coating, chemical vapor deposition (CVD), or atomic layer deposition (ALD); then several orientation grooves are formed on a surface of the alignment film by a rubbing process, namely obtain the alignment layer 50 is obtained and with alignment ability. A material of the alignment layer 50 is, for example, polyimide or silicon dioxide.

Since two glass substrates of a liquid crystal panel (LCD) including thin film transistors (TFTs) also need to be respectively provided with alignment films to orient the orientation of the liquid crystal molecules, in one embodiment, the step of cleaning the wafer substrate 10 can be carried out on a conventional LCD production line.

Figure 6:
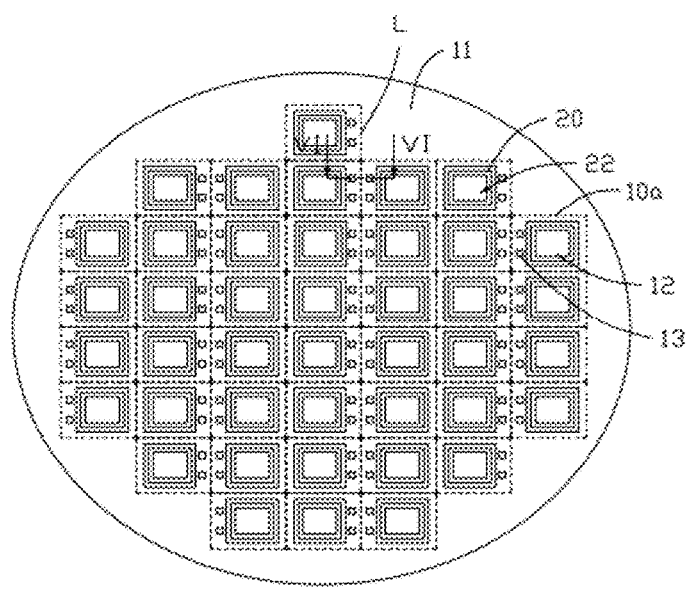
FIG. 6 is a schematized top view of seals formed on the wafer substrate provided by step S3 of the method of FIG. 1.
Figure 7:
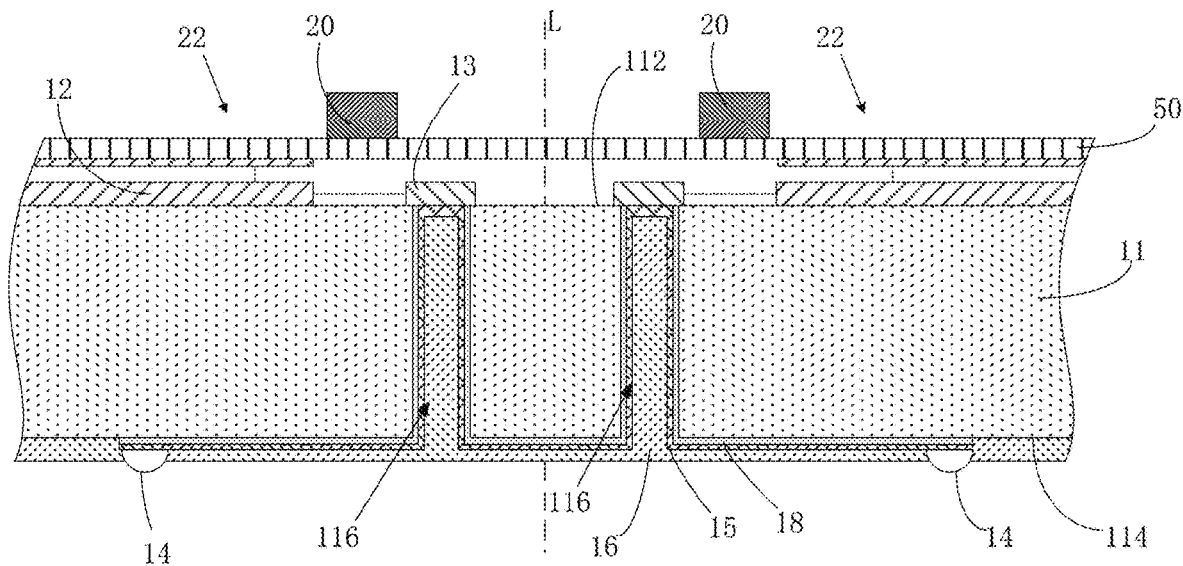
FIG. 7 is a schematized cross-sectional view along line VI-VI of FIG. 6.

As shown in FIG. 6 and FIG. 7, a seal 20 is formed on a side of the first surface 112 in each die area 10a of the wafer substrate 10. Each seal 20 has a substantially closed annular shape. Each seal 20 defines a liquid crystal space 22 for accommodating liquid crystal 30 in the die area 10a where the seal 20 is located at. The seal 20 at least surrounds the pixel circuit area of the active circuit 12, so that light emitted by pixels of the LCoS panel can be emitted within a range framed by the seal. In an embodiment, a width of the seal is in a range of 50 μm to 1000 μm In one embodiment, the seal can be deposited by screen printing or injection dispensing.

Figure 8:
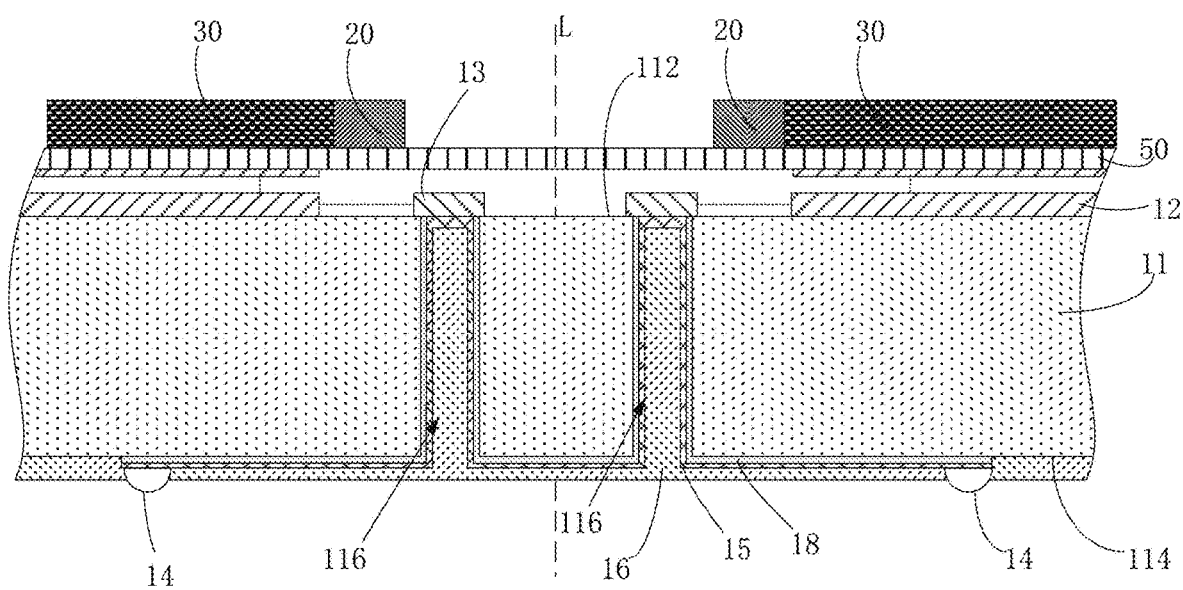
FIG. 8 is a schematized view of liquid crystal injected into each liquid crystal space provided by step S3 of the method.

As shown in FIG. 8, liquid crystal 30 is injected into each liquid crystal space 22 of the wafer substrate 10. The injected liquid crystal 30 covers the active circuit 12, especially covers the pixel circuit area of the active circuit 12. In one embodiment, the liquid crystal 30 is injected by a one drop filling (ODF) process. The ODF process can significantly reduce the filling time of the liquid crystal 30 and improve a utilization rate of the liquid crystal 30. In other embodiments, the liquid crystal 30 may be infilled into the liquid crystal space 22 by injection.

Figure 9:
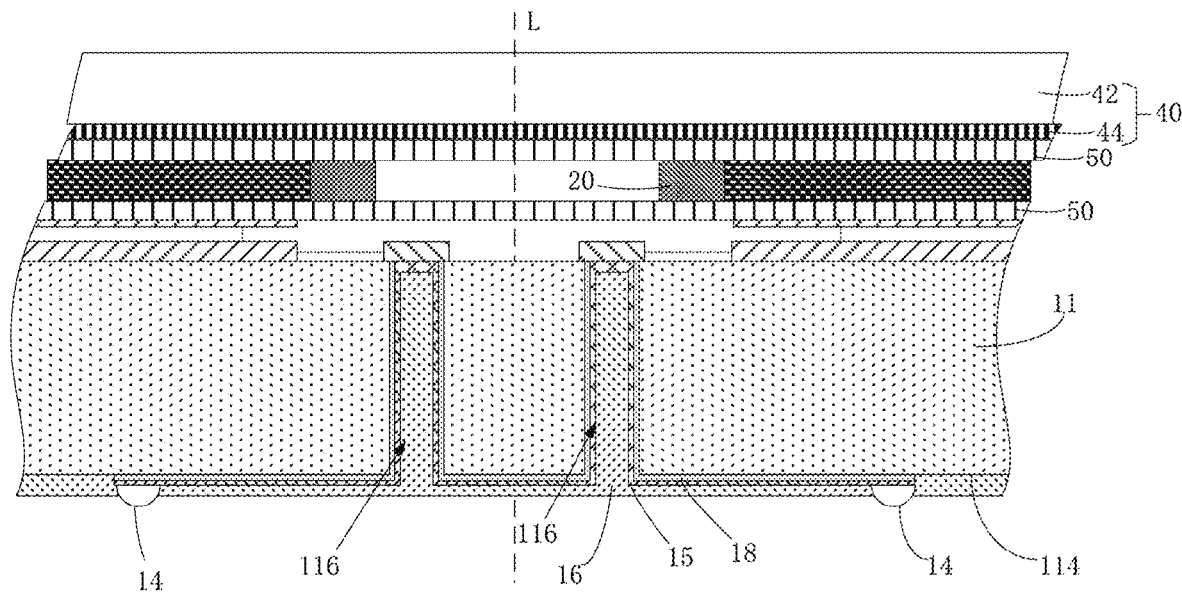
FIG. 9 is a schematized view of a glass substrate and the wafer substrate coupled by seal provided by step S3 of the method of FIG. 1.

As shown in FIG. 9, a glass substrate with a transparent conductive layer is provided, and a side of the glass substrate with the transparent conductive layer is coupled with the wafer substrate by the seal.

In one embodiment, the glass substrate 40 has a same size as the wafer substrate 10. Step S3 further includes cleaning the glass substrate 40 (for example, cleaning with deionized water followed by plasma cleaning), and forming an alignment layer 50 on the glass substrate 40. In the embodiment, a thickness of the glass substrate 40 is in a range of 60 μm to 750 μm, and the glass substrate with thinner thickness can be obtained by grinding.

In one embodiment, the step of cleaning the glass substrate 40 can be carried out on a conventional LCD production line.

A material of the alignment layer 50 is, for example, polyimide or silicon dioxide. As shown in FIG. 9, the glass substrate 40 includes a glass base 42 and a transparent conductive layer 44 on a surface of the glass base 42. The alignment layer 50 is formed on the surface of the transparent conductive layer 44 away from the glass base 42. A material of the transparent conductive layer 44 is, for example, indium tin oxide (ITO), fluorine-doped tin oxide (SnO2F, FTO), aluminum-doped zinc oxide (ZnO: Al, AZO), or other oxide including at least one element selected from indium, antimony, zinc, and cadmium.

Specifically, in a vacuum state, the glass substrate 40 and the wafer substrate 10 are coupled by a laminator, and then the seal 20 is ultraviolet light cured or thermally cured. In an embodiment, both light curing and thermal curing are used. Thermal curing is used to compensate curing of the seal 20 which is not irradiated by the ultraviolet light, so as to avoid the problem of insufficient curing of the seal 20. In addition, the seal 20 not only adheres the wafer substrate 10 and the glass substrate 40, but also plays a role in resisting the intrusion of external contaminants such as water vapor.

In one embodiment, each seal 20 has a plurality of spacers (not shown) to maintain a distance between the wafer substrate 10 and the glass substrate 40. A material of the spacers may be, but is not limited to, plastic, silicon oxide, glass, resin, or other mixtures with similar properties.

In one embodiment, since a size of the liquid crystal space 22 is small, and to prevent the spacers from affecting the movement of liquid crystal molecules, and to prevent the spacers from reducing the pixel filling rate, there is no spacers arranged in the liquid crystal space 22.

As shown in FIG. 9, after the glass substrate 40 is coupled to the wafer substrate 10, the liquid crystal 30 is located between two alignment layers 50, so that the orientation of the liquid crystal molecules is determined.

In Step S4, the glass substrate and the wafer substrate are cut to obtain a plurality of LCoS panels.

Figure 10:
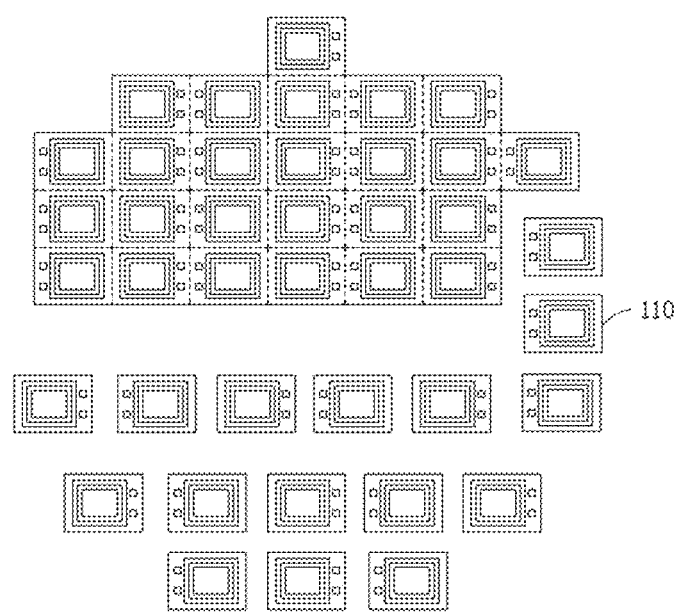
FIG. 10 is a schematized view of the glass substrate and the wafer substrate cut to obtain a plurality of LCoS panels provided by step S4 of the method of FIG. 1.

As shown in FIG. 10, in step S4, the glass substrate 40 and the wafer substrate 10 are cut along the dividing lines L, a plurality of LCoS panels 110 are obtained accordingly.

Specifically, step S4 includes sawing, scribing, and breaking. First, on a general silicon wafer sawing equipment, the silicon substrate 11 is sawn according to the dividing lines L, a plurality of fracture grooves are accordingly formed, and then on a general equipment for scribing glass, a surface of the glass base 42 is scribed to form a plurality of corresponding separation mark lines. Finally, a step of breaking is according to the fracture grooves on the back surface of the silicon substrate 11 (i.e., a side of the second surface 114) and the separation mark lines on the surface of the glass base 42, and the plurality of LCoS panels 110 is thereby separated and obtained.

Figure 11:
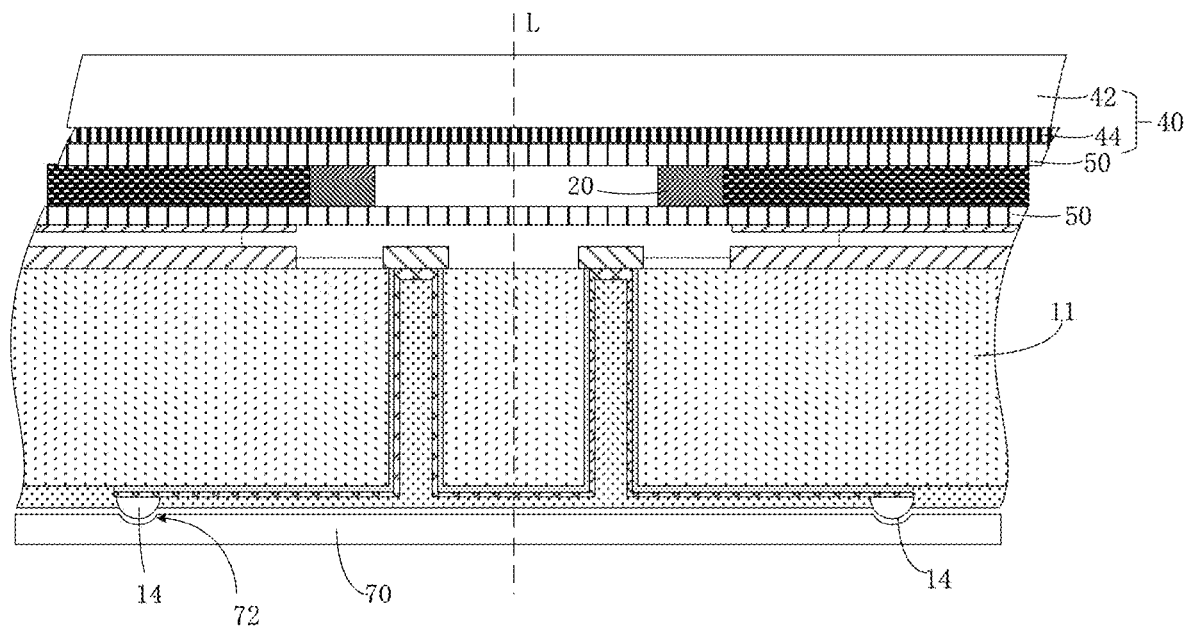
FIG. 11 is a schematized view of a back surface of the wafer substrate placed on a carrier provided by step S4 of the method of FIG. 1.

In step S4, as shown in FIG. 11, the back surface of the wafer substrate 10 is placed on a carrier 70, and the carrier 70 includes grooves 72 for receiving the conductive interfaces 14 at a position corresponding to the conductive interfaces 14. Thus, the conductive interface 14 can be protected on the one hand, and dicing can be facilitated on the other hand.

In one embodiment, each separation mark line is arranged correspondingly to one separation line L. That is, the edge of the cut of the glass substrate 40 and the edge of the cut of the wafer substrate 10 are aligned. Compared with the way that the wafer substrate 10 and the glass substrate 40 are cut according to different dividing lines L, the method can reduce the manufacturing cost, reduce the manufacturing time, and reduce likelihood of damage during the manufacturing process.

In the present disclosure, a total thickness of the obtained LCoS panel is in a range of 130 μm to 1500 μm, which mainly includes a thickness of the glass substrate, the liquid crystal, and the wafer substrate. After cutting, a size of the LCoS panel 110 is the same as a size of die. That is, the packaging process of the present disclosure is chip scale packaging (CSP). The reduction of the overall size of the LCoS panel 110 makes it more suitable for application in the field of head-mounted display and micro-projection.

In Step S5, the LCoS panels are installed, so that each LCoS panel is electrically connected to an external circuit substrate, and a plurality of LCoS modules is obtained.

Figure 12:
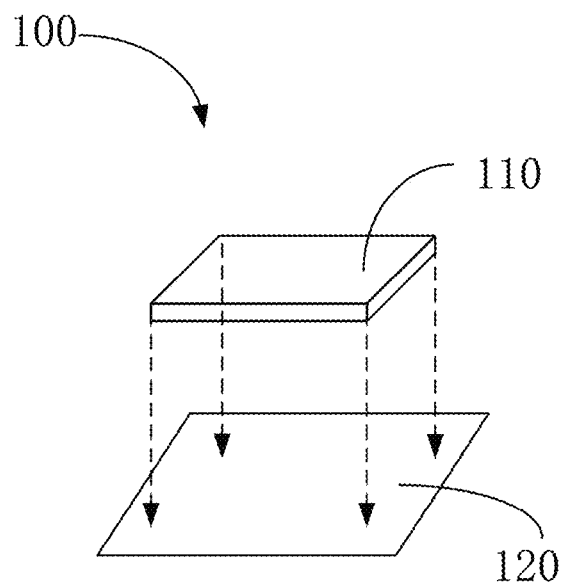
FIG. 12 is a schematized view of an LCoS panel connected to an external circuit substrate to obtain an LCoS module provided by step S5 of method of FIG. 1.

FIG. 12 shows that one LCoS panel 110 is electrically connected to one external circuit substrate 120. The external circuit substrate 120 may be a flexible circuit board or a printed circuit board. The LCoS panel 110 is electrically connected to the external circuit substrate 120 by the conductive interfaces 14, so that the active circuit 12 is electrically connected to the external circuit substrate by the input/output terminals 13, the vias 116, and the conductive interfaces 14 to input and output signals. Specifically, the LCoS module 100 defines a plurality of pixels (not shown), and the active display drive circuit matrix is provided with a group of MOS transistors corresponding to each pixel. Each group of MOS transistors in the active display drive circuit matrix can control the electric field of the liquid crystal molecules corresponding to each pixel by controlling a voltage applied to the reflective electrodes, so as to adjust a rotation angle of the liquid crystal molecules corresponding to each pixel, and further control a polarization state of the outgoing light in the corresponding area of each pixel, and cooperate with a polarization beam splitter to realize image modulation.

In the preparation method of the LCoS panel, after the seal 20 is formed on the entire wafer substrate 10 and the liquid crystal 30 is injected, the wafer substrate 10 is coupled with the glass substrate 40, and then the segmentation step is performed to obtain the plurality of LCoS panels 110. Compared with the method including dividing the whole wafer substrate 10 and the glass substrate 40 into individual pieces, then coating seal, coupling, curing, injecting liquid crystal and other processes, the preparation method of the LCoS panel improves the production efficiency and ensures that the thickness of the liquid crystal in different LCoS panels 110 obtained from the finished product is consistent.

The above embodiments provide a preparation method of an LCoS panel. Under the same concept of the present disclosure, there is another modified embodiment of a preparation method of the LCoS panel. The difference between the technical solution and the above embodiments lies in whether the manufacture of the integrated circuit is before or after the vias are manufactured. Specifically, the preparation method of the modified embodiment includes the following steps.

In step S1', a wafer substrate is provided, wherein the wafer substrate includes a silicon substrate having a first surface and a second surface opposite to each other, and the wafer substrate includes a plurality of die areas defined by a plurality of intersecting dividing lines. Different from step S1, the wafer substrate of the modified embodiment does not have the active circuits 12 and the input/output terminals 13 as shown in FIG. 2 and FIG. 3. That is, the wafer substrate does not include an integrated circuit.

In step S2', wafer level packaging is performed, wherein a plurality of vias extending through the first surface and the second surface is manufactured in each die area of the wafer substrate, then an active circuit is manufactured on the first surface in each die area, the active circuit includes at least a pixel circuit area and a peripheral circuit area, and then a plurality of conductive interfaces is manufactured on the second surface, and each conductive interface is arranged to correspond to one via, and the active circuit is electrically connected to the conductive interfaces by the vias. The process of step S2' is basically the same as that of step S2, and can be reference to each other, except that there are no active circuits and input/output terminals when manufacturing vias. After step S2' is completed, a schematic view can refer to FIG. 4, and the structure above the first surface 112 should be removed.

After step S2' is completed, the structure is shown in FIG. 4, and the subsequent processes can refer to the process of S3-S4 in the embodiment shown in FIG. 1.

In step S3', liquid crystal packaging is performed, wherein a seal is formed on a side of the first surface in each die area of the wafer substrate, so that the seal at least surrounds the pixel circuit area of the active circuit, and the seal defines a liquid crystal space of one die area where the seal is located; liquid crystal is injected into the liquid crystal space of each die area of the wafer substrate; a glass substrate comprising a transparent conductive layer is provided, and a surface of the glass substrate with the transparent conductive layer is coupled with the wafer substrate by the seal. Step S3' can refer to the detailed description of step S3 and its extended implementations.

In Step S4', the wafer substrate is cut along the dividing lines and the glass substrate is correspondingly cut to obtain a plurality of LCoS panels. Step S4' can refer to the detailed description of step S4 and its extended implementations.

Similarly, when the LCoS panel obtained by the preparation method of the embodiment is applied to a product, the preparation method further includes step S5'. Step S5' includes mounting the LCoS panels, so that each LCoS panel is electrically connected to an external circuit substrate to obtain a plurality of LCoS modules, wherein in each LCoS module, the active circuit is sequentially electrically connected to the external circuit substrate by the plurality of vias and the plurality of conductive interfaces. Step S5' can refer to the detailed description of step S5 and its extended implementations. Step S5' also does not have to be regarded as a necessary step of the preparation method of the LCoS panel.

An embodiment of the present disclosure further provides an LCoS panel and an LCoS module manufactured by the above preparation methods of the LCoS panel. The LCoS module includes an LCoS panel, and an external circuit substrate electrically connected the LCoS panel. The LCoS panel is electrically connected to the external circuit substrate by conductive interfaces.

Figure 13:
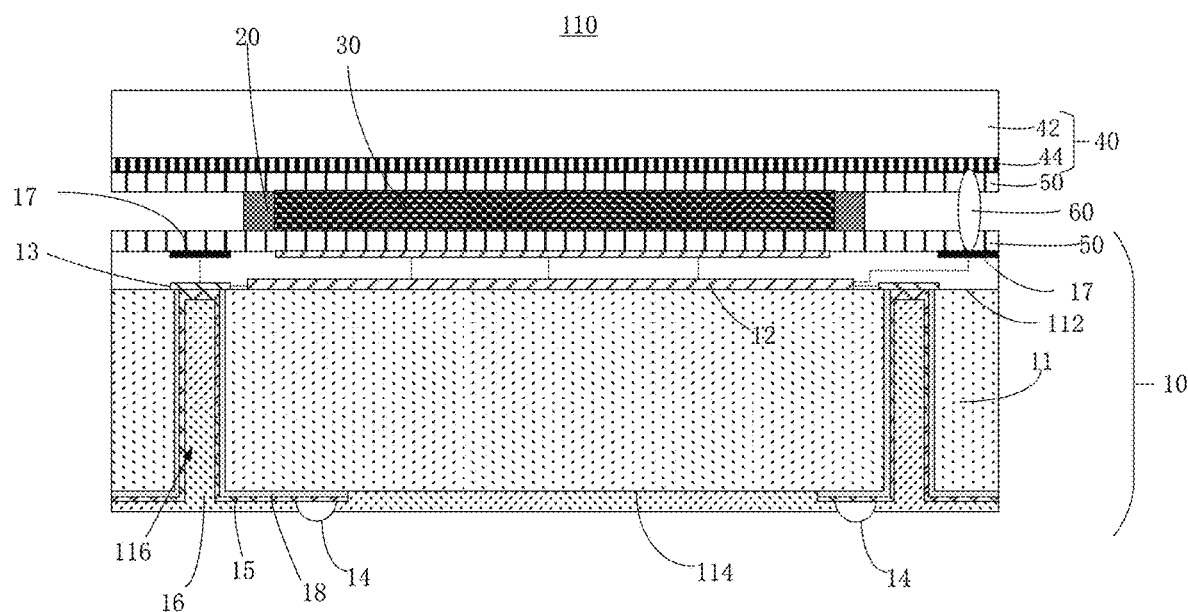
FIG. 13 is a schematized cross-sectional view of an LCoS panel according to an embodiment of the present disclosure.

As shown in FIG. 13, the LCoS panel 110 includes a wafer substrate 10 and a glass substrate 40 opposite to each other. The wafer substrate 10 includes a silicon substrate 11 having a first surface 112 and a second surface 114 opposed to each other. The wafer substrate 10 further includes an active circuit 12 on the first surface 112, a plurality of conductive interfaces 14 on the second surface 114, and a plurality of vias 116 extending through the first surface 112 and the second surface 114. Each conductive interface 14 is arranged to correspond to one via 116, and each conductive interface 14 is electrically connected to the active circuit 12 by one corresponding via 116. The active circuit includes a pixel circuit area and a peripheral circuit area. Specifically, the pixel circuit area includes a plurality of pixel circuits, each pixel circuit corresponds one of the liquid crystal pixels of the LCoS panel. The pixel circuits control the deflection of the liquid crystal molecules by controlling the electric field where the liquid crystal molecules of the liquid crystal pixels are located at. The peripheral circuit area is connected to the pixel circuit area by circuits to process input image signals, power signals and other control signals, thereby outputting control signals of the pixel circuits to the pixel circuit area.

A glass substrate 40 is provided with a transparent conductive layer 44, and the transparent conductive layer 44 is disposed to face the wafer substrate 10. The wafer substrate 10 and the glass substrate 40 are connected by a seal 20 disposed therebetween. The seal 20 at least surrounds the pixel circuit area of the active circuit 12 and defines a liquid crystal space. That is, the seal 20, the wafer substrate 10 and the glass substrate 40 are enclosed to form an enclosed space for filling the liquid crystal 30. A thickness of the glass substrate 40 is in a range of 60 μm to 750 μm.

In one embodiment, a thickness of the silicon substrate 11 is in a range of 60 μm to 200 μm, and an overall thickness of the LCoS panel finally prepared with the silicon substrate 11 is thin, which is favorable for application in scenarios such as head-mounted display or micro-projection. In the embodiment of the present disclosure, the thickness of the silicon substrate 11 ranges from 60 μm to 750 μm. Preferably, the thickness of the silicon substrate 11 is between 100 μm and 200 μm, which takes into account product size, mechanical reliability, and optical flatness, and is also conducive to the preparation of vias 116.

In an embodiment, the LCoS panel 110 further includes an alignment layer 50 for orientating an initial orientation of liquid crystal molecules of the liquid crystal 30. Generally, the alignment layers 50 need to be arranged on both sides of the liquid crystal 30. That is, a surface of the transparent conductive layer 44 of the glass substrate 40 close to the liquid crystal 30 is provided with one alignment layer 50, and a surface of the wafer substrate 10 close to the liquid crystal 30 is also provided with one alignment layer 50.

In one embodiment, a plurality of spacers is provided in the seal 20 to provide a certain mechanical support.

In the LCoS panel, the wafer substrate 10 has vias 116 extending through the silicon substrate 11, and is connected to the vias 116, the input/output terminals 13 and the active circuit 12 by the conductive interfaces 14 arranged on the backside of the wafer substrate 10, so that the production of the LCoS panels can use the production line of passive LCD panels to perform the process of liquid crystal packaging from the frontside surface of the wafer substrate 10, thereby reducing the cost of equipment investment. In addition, the TSV technology is used on the wafer substrate 10 to form vias 116 extending through the silicon substrate 11, so that the LCoS panel 110 is directly connected to the external circuit substrate by the conductive interfaces 14 without FPC wires, thus improving the signal processing speed and further saving cost.

As shown in FIG. 13, a projection of the vias 116 on the wafer substrate 10 surrounds but does not trespass upon the pixel circuit area of the active circuit 12, which can be considered the projection of the vias 116 keeps away from an area below the liquid crystal 30. For the case there is a number of vias, each via keeps away from the pixel circuit area. Accordingly, in the manufacturing process, in the above embodiments of the preparation method, in the step of wafer level packaging (i.e., step S2 or step S2'), for each die area 10a, a projection of the manufactured plurality of vias 116 on the wafer substrate 10 merely surrounds but not trespass upon the pixel circuit area.

Figure 14:
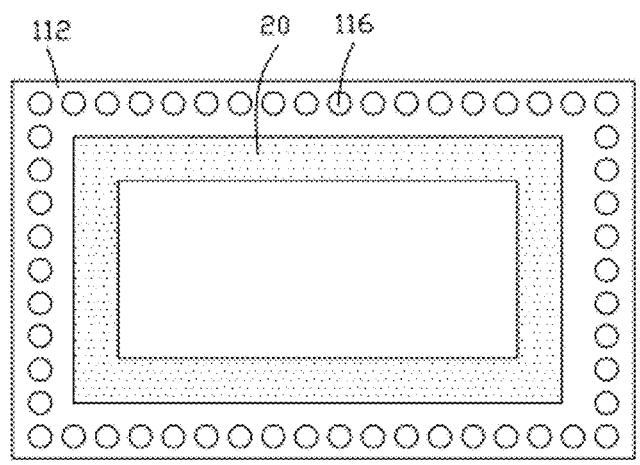
FIG. 14 is a schematized top view of the LCoS panel in FIG. 13.

As shown in FIG. 14, the vias 116 keeps away from the area where the active circuit 12 is located to facilitate the feasibility of the process. In addition, the vias 116 surround the pixel array area, and the vias 116 are arranged around the pixel array area. In one embodiment, the number of vias 116 is as many as sixty or more, and such a dense number of vias further reduces the feasibility of opening holes under the active circuit 12.

In some embodiments of the present disclosure, the projection of the via 116 on the wafer substrate 10 surrounds and keeps away from the peripheral circuit area. As shown in FIG. 13, a portion of the active circuit 12 directly below the seal 20 can be considered as a portion of the peripheral circuit, and two vias 116 as shown in the figure keep away from the portion of the peripheral circuit. Accordingly, in the manufacturing process, in the above embodiments of the preparation method, in the step of wafer level packaging (i.e., step S2 or step S2'), for each die area 10a, the projection of the manufactured plurality of vias 116 on the wafer substrate 10 surrounds and keeps away from the peripheral circuit area.

In another embodiment of the present disclosure, some vias can be arranged in the peripheral circuit area, so that a layout design of the peripheral circuit is flexible, and it is also beneficial to increase the transmission rate of the circuit corresponding to the vias.

In another embodiment, in the above preparation method of an LCoS panel, in step S1 or S2', the active circuit 12 includes a plurality of metal layers, and the plurality of metal layers includes a plurality of input/output terminals 13 located at different locations. Each via 116 is vertically connected to a corresponding one input/output terminal 13 of the metal layer, thereby achieving electrical connection with the pixel circuit area or the peripheral circuit area.

As shown in FIG. 13, the wafer substrate 10 further includes a plurality of conductive pads 17 spaced apart from each other on the first surface. The conductive pads 17 are electrically connected to the active circuit 12. For some vias 116, there is a corresponding conductive pad 17 electrically connected to the vias 116. Additionally, in the manufacturing process, when the wafer substrate 10 is provided in step S1 or the integrated circuit is manufactured in step S2', in each die area 10a, conductive pads 17 spaced apart from each other are arranged on the first surface 112. The plurality of conductive pads 17 is electrically connected to the active circuit 12, and the conductive pads 17 can be used to test the active circuit 12 before or during the step of liquid crystal packaging. The technical solution is advantageous to test the wafer substrate before or during the step of liquid crystal package without damaging the conductive interfaces 14 (for example, it is not necessary to permanently connect the conductive interfaces to a test device), and the test can be performed from the front side of the wafer substrate (namely a side of the first surface), the operation is thus convenient.

In some embodiments of the present disclosure, each via 116 is electrically connected to a unique conductive pad 17. In that case, it is possible to test whether the circuit corresponding to each conductive interface 14 works normally by using the conductive pads 17 as the input and output interfaces.

In some embodiments, the wafer substrate 10 further includes independent conductive pads 17. The conductive pad 17 on the right side as of FIG. 13, on one hand, is electrically connected to the active circuit 12, on other hand, is electrically connected to the transparent conductive layer 44 of the glass substrate 40 by a conductive adhesive 60, thus providing a voltage to the transparent conductive layer 44.

In some embodiments of the present disclosure, some vias 116 are electrically connected a corresponding one of the conductive pads 17, and a projection of each conductive pad 17 and that of the corresponding via 116 are staggered from each other on the wafer substrate 10. The technical solution makes a physical connection between the conductive pads and the active circuit relatively independent from a physical connection between the vias and the active circuit, which makes the circuit layout flexible.

In another embodiment, the projection of each conductive pad 17 and the corresponding via 116 on the wafer substrate 10 overlap (such as the conductive pad and via on the left side of FIG. 13). The technical solution reduces the number of input/output terminals 13 that need to be provided on the metal layer, so that the conductive pads 17 and the vias 116 can be connected to the same input/output terminal 13 at the same time, which is beneficial to reduce the overall size of the LCoS panel 110.

In the present disclosure, the conductive interfaces 14 include at least one of a Ball Grid Array (BGA) package structure, a Pin-Grid Array (PGA) structure, and a Land Grid Array (LGA) package structure. The above types of packaging structure can enable the LCoS panel 110 to be connected to an external circuit substrate in a vertical direction.

Since there is a heating process in the installation mode of the BGA, which may damage the liquid crystal, the connection mode of PGA or LGA is preferred.

From the perspective of the installation temperature of the LCoS panel 110, the preparation method of the present disclosure preferably adopts a lower temperature installation method. In an embodiment of the present disclosure, the conductive interfaces 14 are electrically connected to the external circuit substrate by means of mechanical pressing or mechanical coupling. Furthermore, the LCoS panel and the external circuit substrate can be further fixed by clasping, thus improving the connection reliability of mechanical pressing or mechanical coupling.

Figure 15:
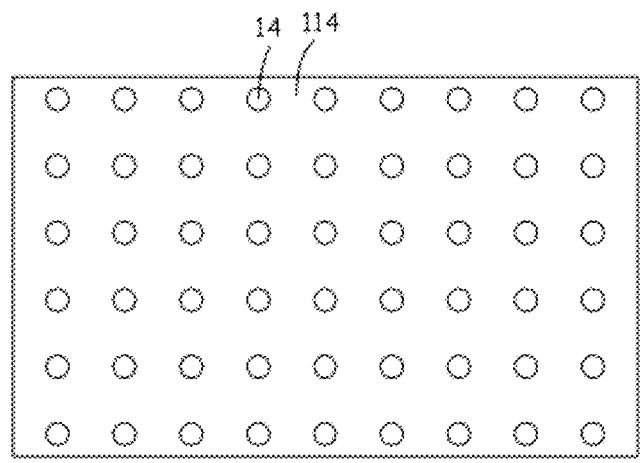
FIG. 15 is a schematized bottom view of the LCoS panel in FIG. 13.

As shown in FIG. 15, the conductive interfaces 14 are arranged in an array on the second surface 114 of the silicon substrate 11. Through the TSV technology, the silicon substrate 11 is perforated, so that the active circuit 12 is guided from the first surface 112 of the silicon substrate 11 to the second surface 114 of the silicon substrate 11. The conductive interfaces 14 are arranged on the second surface 114 of the silicon substrate 11, so that the conductive interfaces 14 can be electrically connected to the external circuit substrate 120.

Referring to FIG. 14 and FIG. 15, the projection of some conductive interfaces 14 on the wafer substrate 10 is closer to the center of the LCoS panel 110 than that of the vias 116 corresponding to the conductive interfaces 14 on the wafer substrate. By connecting the vias and the conductive interfaces using the circuit on the second surface of the wafer substrate, some conductive interfaces can be distributed in the position of the corresponding pixel circuit area of the die, which avoids overcrowding of the conductive interfaces at the edge. At the same time, a size of the conductive interface can be enlarged, and higher transmission efficiency can be obtained. In the embodiment shown in FIG. 15, the conductive interfaces 14 are uniformly arranged in an array on the second surface 114. It can be understood that the present disclosure does not limit the specific arrangement of the conductive interfaces 14 on the second surface, and the conductive interface 14 may also be arranged in a non-uniform manner, not illustrated here.

The above embodiments are only used to illustrate the technical solutions of the present disclosure and not to limit them. Although the present disclosure has been described in detail with reference to the preferred embodiments, those of ordinary skill in the art should understand that the technical solutions of the present disclosure can be modified or equivalently replaced without departing from the spirit and scope of the technical solutions of the present disclosure.

What is claimed is:

1. A preparation method of a liquid crystal on silicon (LCoS) panel, comprising:
providing a wafer substrate, wherein the wafer substrate comprises a silicon substrate and a plurality of die areas defined by a plurality of intersecting dividing lines, the silicon substrate comprises a first surface and a second surface opposite to the first surface, each of the plurality of die areas comprises an active circuit on the first surface, and the active circuit comprises a pixel circuit area and a peripheral circuit area;
performing wafer level packaging by:
manufacturing a plurality of vias extending through the first surface and the second surface in each of the plurality of die areas of the wafer substrate; and
manufacturing a plurality of conductive interfaces on the second surface, wherein each of the plurality of conductive interfaces is arranged to correspond to one of the plurality of vias, and each of the plurality of conductive interfaces is electrically connected to the active circuit of one of the plurality of die areas where the conductive interface is located by a corresponding one of the plurality of vias;
performing liquid crystal packaging by:
forming a seal on the first surface in each of the plurality of die areas of the wafer substrate, wherein the seal at least surrounds the pixel circuit area of the active circuit, and defines a liquid crystal space of one of the plurality of die areas where the seal is located;
injecting liquid crystal into the liquid crystal space of the wafer substrate;
providing a glass substrate comprising a transparent conductive layer, and
forming a plurality of enclosed spaces filled with the liquid crystal by coupling a surface of the glass substrate with the transparent conductive layer and the wafer substrate by the seal; and
cutting the wafer substrate along the plurality of dividing lines, cutting the glass substrate, and further obtaining a plurality of LCoS panels, wherein each of the plurality of LCoS panels is provided with a corresponding one of the plurality of enclosed spaces, an LCoS module is obtained when one of the plurality of LCoS panels is electrically connected to an external circuit substrate, and the active circuit is electrically connected to the external circuit substrate by the plurality of vias and the plurality of conductive interfaces in sequence; and during the wafer level packaging, projections of the plurality of vias on the wafer substrate surround and keep away from the pixel circuit area in each of the plurality of die areas.

2. The preparation method of the LCoS panel according to claim 1, wherein a thickness of the silicon substrate is in a range of 60 μm to 750 μm, and a thickness of the glass substrate is in a range of 60 μm to 750 μm.

3. The preparation method of the LCoS panel according to claim 1, wherein during the wafer level packaging, the projections of the plurality of vias on the wafer substrate surround and keep away from the peripheral circuit area in each of the plurality of die areas.

4. The preparation method of the LCoS panel according to claim 1, wherein the active circuit comprises a plurality of metal layers, and the plurality of metal layers comprises a plurality of input/output terminals located at different locations, and each of the plurality of vias is vertically connected to one of the plurality of input/output terminals, and the active circuit electrically connects the pixel circuit area or the peripheral circuit area.

5. The preparation method of the LCoS panel according to claim 1, further comprising a plurality of conductive pads spaced apart from each other and arranged in each of the plurality of die areas of the first surface, the plurality of conductive pads being electrically connected to the active circuit, and configured to test the active circuit before or during the liquid crystal packaging.

6. The preparation method of the LCoS panel according to claim 5, wherein in each of the plurality of die areas, at least one of the plurality of vias corresponds to one of the plurality of conductive pads and is electrically connected to a corresponding conductive pad, and a projection of each of the plurality of conductive pads and that of the corresponding one of the plurality of vias on the wafer substrate are staggered from each other.

7. The preparation method of the LCoS panel according to claim 5, wherein during the liquid crystal packaging, the seal does not cover the plurality of conductive pads.

8. The preparation method of the LCoS panel according to claim 1, wherein the plurality of conductive interfaces comprises at least one of a ball grid array package structure, a pin grid array structure, and a grid array package structure.

9. The preparation method of the LCoS panel according to claim 1, wherein the plurality of conductive interfaces is electrically connected to the external circuit substrate by means of mechanical pressing or mechanical coupling.

10. The preparation method of the LCoS panel according to claim 1, wherein a projection of at least one of the plurality of conductive interfaces on the wafer substrate is closer to a center of one of the plurality of LCoS panels where the plurality of conductive interfaces is located than that of a corresponding one of the plurality of vias on the wafer substrate.

11. An LCoS panel, comprising:
a wafer substrate comprising:
a silicon substrate comprising a first surface and a second surface opposite to the first surface,
an active circuit arranged on the first surface, comprising a pixel circuit area and a peripheral circuit area,
a plurality of conductive interfaces arranged on the second surface, and
a plurality of vias extending through the first surface and the second surface, each of the plurality of conductive interfaces is arranged to correspond to one of the plurality of vias, and electrically connected to the active circuit by a corresponding one of the plurality of vias;
a glass substrate comprising a transparent conductive layer, and being opposite to the wafer substrate;
a seal arranged between the wafer substrate and the glass substrate, surrounding the pixel circuit area of the active circuit and defining a liquid crystal space; and
liquid crystal in the liquid crystal space;
wherein an enclosed space filled with the liquid crystal is defined by coupling a surface of the glass substrate with the transparent conductive layer and the wafer substrate by the seal, and one of the plurality of conductive interfaces is configured to electrically connect the LCoS panel to an external circuit substrate; and projections of the plurality of vias on the wafer substrate surround and keep away from the pixel circuit area.

12. The LCoS panel according to claim 11, wherein the projections of the plurality of vias on the wafer substrate surround and keep away from the peripheral circuit area.

13. The LCoS panel according to claim 11, wherein the active circuit comprises a plurality of metal layers, and the plurality of metal layers comprises a plurality of input/output terminals located at different locations of the plurality of metal layers, and each of the plurality of vias is vertically connected to a corresponding one of the plurality of input/output terminals to electrically connect the pixel circuit area or the peripheral circuit area.

14. The LCoS panel according to claim 11, wherein the wafer substrate further comprises a plurality of conductive pads spaced apart from each other on the first surface, the plurality of conductive pads is electrically connected to the active circuit, and at least one of the plurality of vias is electrically connected to a corresponding one of the plurality of conductive pads.

15. The LCoS panel according to claim 11, wherein a projection of at least one of the plurality of conductive interfaces on the wafer substrate is closer to a center of the LCoS panel than a projection of the corresponding one of the plurality of vias on the wafer substrate.

16. The LCoS panel according to claim 11, wherein a thickness of the silicon substrate is in a range of 60 μm to 750 μm, and a thickness of the glass substrate is in a range of 60 μm to 750 μm.

17. The LCoS panel according to claim 16, wherein the thickness of the silicon substrate is in a range of 60 μm to 200 μm.

* * * * *